(12) United States Patent
Jewell

(10) Patent No.: US 7,542,493 B2
(45) Date of Patent: Jun. 2, 2009

(54) TEMPERATURE COMPENSATED LASERS

(75) Inventor: Jack L. Jewell, Boulder, CO (US)

(73) Assignee: JDS Uniphase Corporation, Ottawa, Ontario (CA)

( * ) Notice: Subject to any disclaimer, the term of this patent is extended or adjusted under 35 U.S.C. 154(b) by 261 days.

(21) Appl. No.: 11/046,735

(22) Filed: Feb. 1, 2005

(65) Prior Publication Data

US 2006/0062266 A1 Mar. 23, 2006

Related U.S. Application Data

(62) Division of application No. 10/376,480, filed on Mar. 3, 2003, now Pat. No. 6,980,579, which is a division of application No. 09/599,945, filed on Jun. 23, 2000, now Pat. No. 6,556,607.

(51) Int. Cl.
*H01S 3/00* (2006.01)

(52) U.S. Cl. .............................. 372/33; 372/34; 372/36; 372/38.05; 372/50.124

(58) Field of Classification Search .................. 372/33, 372/34, 36, 38.05, 50.124
See application file for complete search history.

(56) References Cited

U.S. PATENT DOCUMENTS

| | | | | |
|---|---|---|---|---|
| 5,491,712 | A * | 2/1996 | Lin et al. | 372/50.21 |
| 5,497,389 | A | 3/1996 | Kasukawa et al. | |
| 5,606,572 | A * | 2/1997 | Swirhun et al. | 372/96 |
| 5,724,374 | A * | 3/1998 | Jewell | 372/45.01 |
| 5,897,329 | A * | 4/1999 | Jewell | 438/38 |
| 6,341,138 | B1 | 1/2002 | Peters et al. | |
| 6,556,607 | B1 * | 4/2003 | Jewell | 372/49.01 |
| 6,597,713 | B2 * | 7/2003 | Ouchi | 372/36 |
| 6,980,579 | B2 * | 12/2005 | Jewell | 372/96 |

* cited by examiner

*Primary Examiner*—Minsun Harvey
*Assistant Examiner*—Yuanda Zhang
(74) *Attorney, Agent, or Firm*—Jagtiani + Guttag

(57) ABSTRACT

A novel approach for providing temperature compensation for semiconductor lasers is disclosed. This approach utilizes reflectivity characteristics in the at least one of the mirrors of the semiconductor laser to provide temperature compensation to the device.

12 Claims, 5 Drawing Sheets

TEMPERATURE COMPENSATED LASERS

CROSS-REFERENCE TO RELATED APPLICATIONS

This application is a divisional of U.S. application Ser. No. 10/376,480 filed Mar. 3, 2003, which is a divisional of U.S. application Ser. No. 09/599,945 filed Jun. 23, 2000, now U.S. Pat. No. 6,556,607. The entire disclosure and contents of the above patents and applications are hereby incorporated by reference.

This application is a divisional application of U.S. application. Ser. No. 09/599,945, filed Jun. 23, 2000, entitled, "Temperature Compensated Lasers." This application makes reference to the following co-pending U.S. Patent Applications which are listed below. The first application is U.S. application. Ser. No. 08/699,697, entitled "Extended Wavelength Strained Layer Lasers Having Short Period Superlattices," filed Sep. 26, 1996. The second application is U.S. application. Ser. No. 08/721.589. entitled "Extended Wavelength Strained Layer Lasers Having Strain Compensated Layers," filed Sep. 26, 1996. The third application is U.S. application. Ser. No. 08/721.590. entitled "Extended Wavelength Strained Layer Lasers Having Nitrogen Disposed Therein," filed Sep. 26, 1996. The fourth application is U.S. application. Ser. No. 08/574.165, entitled "Conductive element with Lateral Oxidation Barrier," filed Dec. 18, 1995. The contents and disclosures of these applications are hereby incorporated by reference.

This invention is made with government support under contract number DASG60-98-C-0032, awarded by the US Army Space and Missile Defense Command. The government may have certain rights in this invention.

BACKGROUND OF THE INVENTION

1. Field of the Invention

The present invention relates to semiconductor lasers and more particularly to temperature compensation techniques for slope efficiency.

2. Description of the Prior Art

For most of the history of semiconductor lasers, both the current threshold $I_{th}$ and the slope efficiency $\eta$ decreased monotonically and generally exponentially with increasing temperature of the active material. With the advent of VCSELs, it has been possible to vary the tuning of the cavity resonance with respect to the peak of the optical gain in order to produce a non-monotonic variation in the $I_{th}$ which is most simply approximated by a quadratic function. This technique generally referred to as "gain offset" is well known in the VCSEL field. The VCSEL design parameters are generally set such that the variation in threshold is minimized over the operating temperature range. Gain offset has been demonstrated to a lesser degree in edge-emitting DFB lasers. Gain offset is not applicable to Fabry-Perot semiconductor lasers whose effective cavity length is about 10 μm or more. In all these lasers, and in fact in all known semiconductor lasers, the slope efficiency still decreases monotonically with temperature and is only negligibly, e.g. only to 2nd order, affected by gain offset. The temperature variation of the slope efficiency $d\eta/dT$ has been governed by quantum mechanical confinement of the electrons and holes in the active region.

In prior art devices, there has been no effective method for controlling temperature variation of the slope efficiency $d\eta/dT$. The only method utilized by prior art devices is to optimize the quantum mechanical confinement within the limitations of the material system. This approach is generally already used to its maximum practical limit. It only reduces the decay of slope efficiency with temperature, but its effect is limited by the availability of material structures that are consistent with the desired laser emission wavelength. Furthermore, optimizing for quantum mechanical confinement may involve compromises with other aspects of the laser such as electrical resistance or manufacturability.

SUMMARY OF THE INVENTION

It is therefore an object of the present invention to provide a method and device for controlling temperature variation of the slope efficiency $d\eta/dT$.

It is a further object to provide a semiconductor laser having at least one mirror whose reflectivity or transmissivity, at the laser wavelength, varies with temperature.

It is yet another object to provide a semiconductor laser having an output power which is stable over an operating region when the temperature of the laser fluctuates.

It is yet another object to provide a semiconductor laser having a flattened slope efficiency vs. temperature which is controlled by optical means.

In all of the above embodiments, it is an object to provide a robust semiconductor laser having temperature stability that is provided by optical means.

Finally, it is an object of the invention to provide a semiconductor laser having at least one mirror structure whose change in reflectivity or transmissivity, is used to compensate for temperature change in the semiconductor laser.

According to one broad aspect of the present invention, there is provided a semiconductor laser, the semiconductor laser having an emission wavelength and comprising: a light emitting material; means for causing the light emitting material to emit light; at least first and second mirrors disposed on opposite sides of the light emitting material thereby forming an optical cavity inside which lasing occurs and from which output power is emitted through the second mirror; and optical means for compensating the semiconductor laser for temperature variations in the slope of output power vs. input power of the semiconductor laser.

According to another broad aspect of the invention, there is provided a semiconductor laser, the semiconductor laser having a first emission wavelength and comprising: a light emitting material; means for causing the light emitting material to emit light; and at least first and second mirrors disposed on opposite sides of the light emitting material thereby forming an optical cavity inside which lasing occurs and from which output power is emitted through the second mirror, the second mirror having a first reflectivity at a first emission wavelength at a first temperature, and a second reflectivity lower than the first reflectivity at a second emission wavelength at a second temperature higher than the first temperature.

According to yet another broad aspect of the invention, there is provided a semiconductor laser, the semiconductor laser having a first emission wavelength and comprising: a light emitting material; means for causing the light emitting material to emit light; and at least first and second mirrors disposed on opposite sides of the light emitting material thereby forming an optical cavity inside which lasing occurs and from which output power is emitted through the second mirror, the first mirror having a first reflectivity at a first emission wavelength at a first temperature, and a second reflectivity lower than the first reflectivity at a second emission wavelength at a second temperature higher than the first temperature.

According to yet another broad aspect of the invention, there is provided a semiconductor laser, the semiconductor laser having a first emission wavelength at a first temperature and comprising: a light emitting material; means for causing the light emitting material to emit light; and at least first and second mirrors disposed on opposite sides of the light emitting material thereby forming an optical cavity inside which lasing occurs and from which output power is emitted through the second mirror, wherein either or both of the first or second mirrors has at least a portion which has a respective local minimum in reflectivity disposed between two respective maximums in reflectivity the respective local minimum disposed near the emission wavelength at a first temperature.

According to yet another broad aspect of the invention, there is provided a semiconductor laser, the semiconductor laser having a first emission wavelength at a first temperature and comprising: a light emitting material; means for causing the light emitting material to emit light; at least first and second mirrors disposed on opposite sides of the light emitting material thereby forming an optical cavity inside which lasing occurs and from which output power is emitted through the second mirror, wherein the first mirror has a first transmissivity at the first emission wavelength at the first temperature, the second mirror has a second transmissivity at the first emission wavelength at the first temperature, the first mirror has a third transmissivity at a second emission wavelength at a second temperature higher than the first temperature, the second mirror has a fourth transmissivity at the second emission wavelength at the second temperature, a ratio of the fourth transmissivity to the third transmissivity being larger that a ratio of the second transmissivity to the first transmissivity; and optical means for compensating the semiconductor laser for temperature variations in the slope of the output power vs. input power of the semiconductor laser.

According to yet another broad aspect of the invention, there is provided a semiconductor laser, said semiconductor laser having a first emission wavelength at a first temperature and comprising: a light emitting material; means for causing said light emitting material to emit light; at least first and second mirrors disposed on opposite sides of said light emitting material thereby forming an optical cavity inside which lasing occurs and from which output power is emitted through said second mirror, wherein said first mirror comprises at least first and second respective layers, said first layer comprising a high-index material and said second layer comprising a low-index material, said first layer having a $\Delta n/\Delta T$ which is greater than a $\Delta n/\Delta T$ associated with said second layer; and optical means for compensating said semiconductor laser for temperature variations in the slope of the output power vs. input power of said semiconductor laser.

Other objects and features of the present invention will be apparent from the following detailed description of the preferred embodiment.

BRIEF DESCRIPTION OF THE DRAWINGS

The invention will be described in conjunction with the accompanying drawings, in which.

DETAILED DESCRIPTION OF THE PREFERRED EMBODIMENT

Figure 1:
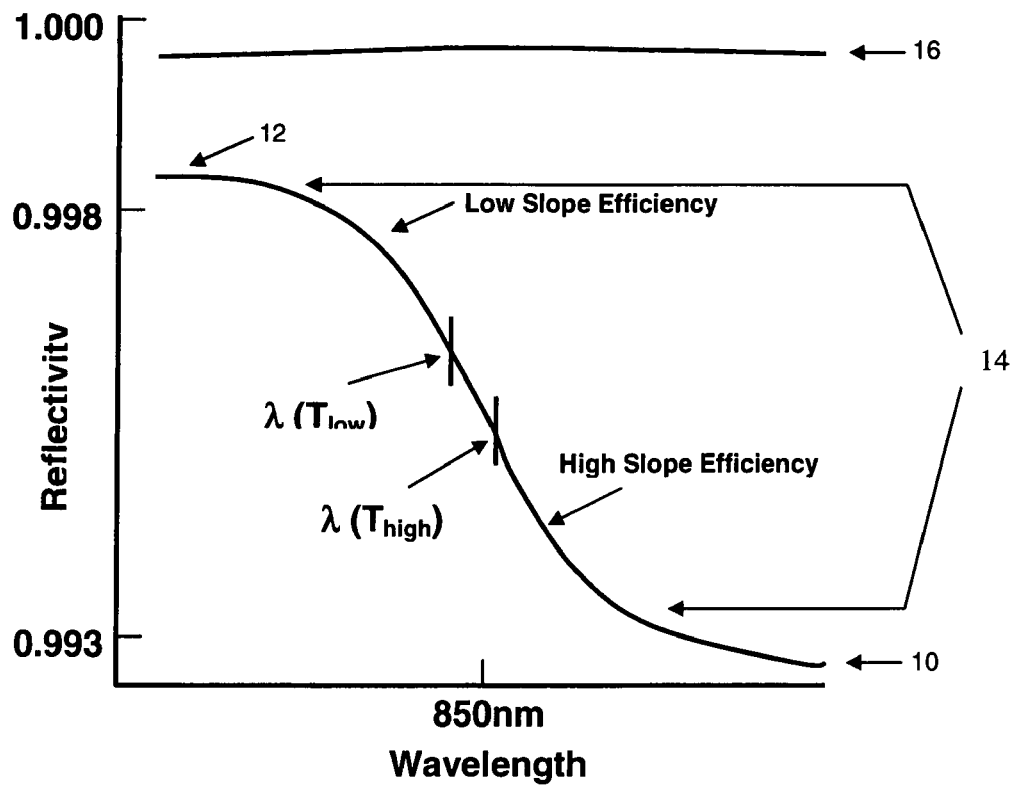
FIG. 1 is a graph of reflectivity vs. wavelength of a semiconductor laser having an output mirror modified for slope efficiency temperature compensation and constructed in accordance with a preferred embodiment of the invention.

It is advantageous to define several terms before describing the invention. It should be appreciated that the following definitions are used throughout this application.

Definitions

Where the definition of a term may depart from the commonly used meaning of the term, the intention is to utilize the definitions provided below, unless specifically indicated.

The term "mirror" is any structure comprising at least one interface between two materials that reflects at least a portion of light that interacts with the interface. The interface may be an abrupt boundary between two materials or material layers, or it may comprise a continuous gradation in material composition. Mirrors include, but are not limited to semiconductor layers, oxidized layers, dielectric layers, alternating layers of high and low index semiconductor material, semiconductor-air interfaces, dielectric-air interfaces, or any combination of the above-identified layers.

The term "peak transition energy," usually measured in units of eV, refers to the photon energy at which luminescence is highest. Energy varies inversely with wavelength and may be determined by the following formula:

$$\text{Energy} = 1.24/\text{Wavelength} \tag{1}$$

with energy in electron volts (eV) and wavelength in micrometers (μm).

The term "peak transition wavelength (energy)," usually is measured in μm or nm (eV), and refers to the emission wavelength (energy) of a semiconductor material at which luminescence is highest. It should be appreciated that while a semiconductor material may emit at one peak transition wavelength (energy), there are limited bands on either side of this peak transition wavelength (energy) in which light is also emitted.

It should be appreciated that we may use the term "transition wavelength (energy)" in the application. Unless specifically pointed out, we intend the term "transition wavelength (energy)" to have the meaning of the term "peak transition wavelength (energy)," defined above. It should be appreciated that there may be a significant difference between "peak transition wavelength (energy)" and "emission wavelength (energy)."

The term "Emission wavelength (energy)" or "lasing wavelength" refers to the wavelength (photon energy) of maximum emission from the overall device. Therefore, these terms are not used interchangeably, unless specifically enumerated.

For most forms of in-plane lasers, the emission wavelength (energy) is very close to the peak wavelength (energy) of the optical gain, which in turn is very close to the peak transition wavelength (energy). For VCSELs and resonant cavity LEDs the emission wavelength (photon energy) may differ significantly from the peak transition wavelength (energy).

The term "absorption edge" refers to the spectral region of a semiconductor where the optical absorption transitions from relatively low to high. Generally, it occurs at a wavelength very close to the peak transition wavelength (energy), but is used in the context of optical absorption rather than light emission.

All concentrations for chemical elements are provided in ratios which range from 0.0 to 1.0, where 1.0 corresponds to 100% of that element. It should also be appreciated that when we discuss an element in a group III or V semiconductor material, the ratio applies to the concentration of the elements in either the group III or group V materials and not the entire semiconductor material. For example, an In concentration of 0.5 would correspond to 50% In concentration of the group III material used to construct the semiconductor material and not to 50% of the entire semiconductor material. If no concentration of a material is provided, then any concentration of the material may be present. For example, if it is indicated that nitrogen (N) is present and no particular amount is specified, then any amount of nitrogen is within the scope of the present invention. This scheme is used throughout the application unless specifically enumerated. It should be appreciated that other group elements such as I, II, IV, VI, VII, VIII, transition, or rare-earth elements, in small quantities, may also be utilized in conjunction with the group III/V materials specifically discussed.

Description

The present invention provides an optical technique which makes it possible to control the temperature variation of the slope efficiency, $d\eta/dT$, whereby it can be made larger or smaller in magnitude, made to approximate zero over limited ranges, or even made positive. The key to this achievement is for the laser to have at least one mirror whose reflectivity or transmissivity at the laser wavelength varies with temperature. For example, if the output mirror reflectivity of a VCSEL decreases with increasing temperature, that decrease in reflectivity increases $\eta$, which thereby compensates for the quantum-mechanically caused decrease in $\eta$.

Figure 7:
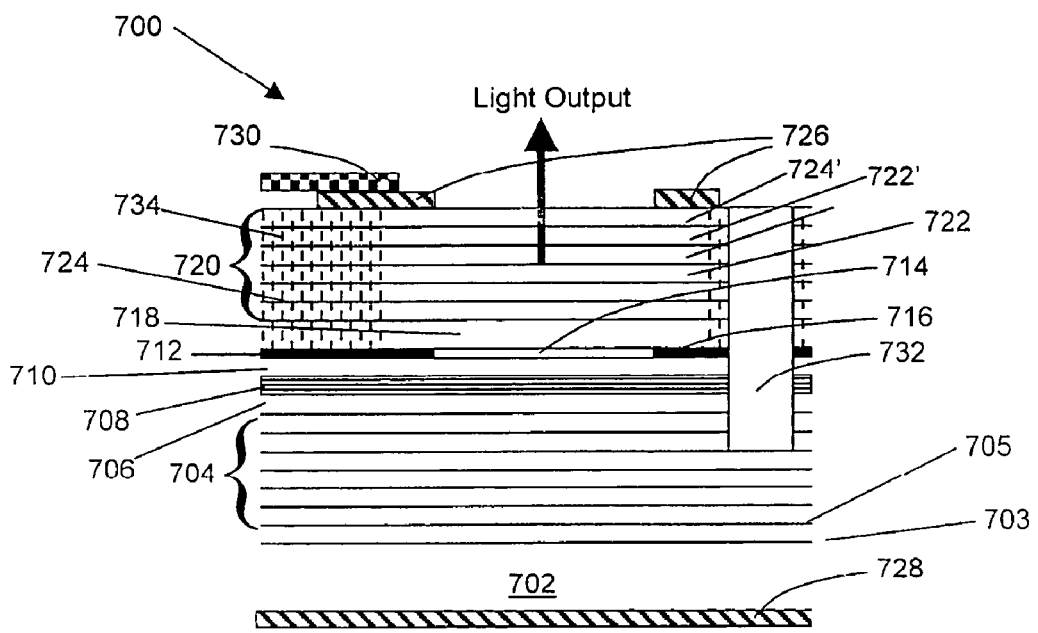
FIG. 7 is a cross-sectional side view of a VCSEL constructed in accordance with a preferred embodiment of the invention and using the teachings of FIGS. 1, 2, 4 5 6, 8, 9, 10A and 10B.

With reference to the Figures, wherein like references characters indicate like elements throughout the several views and, in particular, with reference to FIG. 7, semiconductor laser 700 comprising substrate 702, a bottom mirror 704, an optional first spacer 706, active region 708, an optional second spacer 710, optional oxidation aperture 712 comprising optional non-oxidized portions 714 surrounded by optional oxidized portions 716, an optional conductive spacer 718, top mirror 720 comprising optional low-index layers 722 and optional high-index layers 724, optional top contact 726, optional bottom contact 728, and optional interconnect metal 730. As may be seen by layers 722' and 724', mirror 720 may be composed of differing materials. This is discussed in greater detail in FIG. 8, below. Isolation between lasers 700 may be provided by trenches 732, by insulating regions 734, or by building lasers 700 on mesas. Mirrors 704 and 720, along with active region 708 and optionally one or more spacers, form an optical cavity. Of the light which escapes by transmission through the mirrors, by definition the majority of output light emits through the "output mirror" which may be either top mirror 720 or bottom mirror 704. The mirror opposite the output mirror is referred to as the "non-output mirror."

It should be appreciated that FIG. 7 illustrates a vertical cavity surface emitting laser (VCSEL) but may represent any semiconductor laser constructed in accordance with the teachings of the present invention. Therefore, the particular structure of the laser is not of importance, other than as described below. Any semiconductor laser structure may be utilized with the teachings of the present invention so long as the laser has an active region having an emission wavelength and at least one mirror having a peak reflectivity disposed at a different wavelength than the emission wavelength of the active region. The preferred embodiment is a laser in which the cavity length is short enough for the laser to emit in only a single longitudinal mode. Thus, VCSELs are especially well suited for this invention. For specific examples of other semiconductor laser structures, see U.S. application Ser. No. 08/699,697, entitled "Extended Wavelength Strained Layer Lasers Having Short Period Superlattices," filed Sep. 26, 1996; U.S. application Ser. No. 08/721,589, entitled "Extended Wavelength Strained Layer Lasers Having Strain Compensated Layers," filed Sep. 26, 1996; U.S. application Ser. No. 08/721,590, entitled "Extended Wavelength Strained Layer Lasers Having Nitrogen Disposed Therein," filed Sep. 26, 1996; and U.S. application Ser. No. 08/574,165, entitled "Conductive element with Lateral Oxidation Barrier," filed Dec. 18, 1995. These applications are hereby incorporated by reference.

Turning now to FIG. 1, a graph of reflectivity vs. wavelength of a semiconductor laser having an output mirror modified for slope efficiency temperature compensation and constructed in accordance with a preferred embodiment of the invention is illustrated. This figure will be discussed in conjunction with semiconductor laser 700 of FIG. 7. It should be appreciated that the teachings, discussed below, are applicable to any semiconductor laser having a active region 708, top mirror 720 and bottom mirror 704. As will be seen, semiconductor laser 700 has an emission wavelength around 850 nm, which is longer at higher temperatures. The exact emission wavelength is not relevant to the teachings of the present invention and the teachings herein apply equally well to any other wavelengths, for example, those around 650 nm, 1300 nm and 1550 nm. For convenience, unless otherwise stated, the descriptions will be in terms of a laser in which the top mirror 720 is the output mirror and bottom mirror 704 is the non-output mirror. It should be appreciated however that the reverse may be true. In a conventional laser, the mirrors would be designed to have a peak reflectivity at the emission wavelength. This would be illustrated by shifting curve 10 to the right so that region 12 is disposed above the emission wavelength. Region 12 has the characteristic that the reflectivity of the mirror does not change appreciably with change in wavelength. This is illustrated by the relatively horizontal region 12 of curve 10. Thus, the first order derivative, i.e., A reflectivity vs. emission wavelength is approximately zero. It should be appreciated that the emission wavelength increases with increased temperature. The prior art devices have attempted to enlarge region 12. This approach has the advantage of improving manufacturability but sacrifices compensation for temperature variations.

We have found that by designing a mirror 720, 704 to have a peak reflectivity at a different wavelength than the emission wavelength, one is able to provide temperature compensation to semiconductor laser 700. This is illustrated by $\lambda(T_{low})$ and $\lambda(T_{high})$ in FIG. 1. In the most preferred embodiment, mirrors 720 or 704 are designed to have the maximum of the first order derivative, i.e., A reflectivity vs. emission wavelength disposed at the emission wavelength of semiconductor laser 700. Thus, by modifying the optical characteristics of mirror 720 or mirror 704 one is able to achieve temperature compensation of semiconductor laser 700. This approach has the following advantages: 1) temperature compensation is achievable by optical means; 2) temperature compensation is achievable to a much greater degree than has previously been possible; 3)the temperature compensation may be controlled quantitatively; and 4) the temperature compensation is easily achieved. A slight disadvantage in the specific embodiment described by FIG. 1 is that the decreasing reflectivity with increasing temperature means that the threshold current $I_{th}$ increases with temperature. This may be compensated by a greater magnitude of gain offset. As may be seen in FIG. 1, non-output mirror 704 has a relatively flat reflectivity curve 16.

The reflectivity vs. wavelength characteristic may be most easily achieved for a top mirror 720 which has a portion of the reflectivity achieved by dielectric layers. The dielectric layers would be thinner than would normally be used, thereby shifting the peak reflectivity to shorter wavelengths. The same may be achieved by having all or a portion of semiconductor mirror layers being thinner than a quarter wave optical thickness at the lasing wavelength. Use of thinner semiconductor mirror layers furthermore may be used in bottom mirror 704 for lasers in which bottom mirror 704 is the output mirror. Bottom mirror 704 preferably comprises all semiconductor layers.

Figure 5:
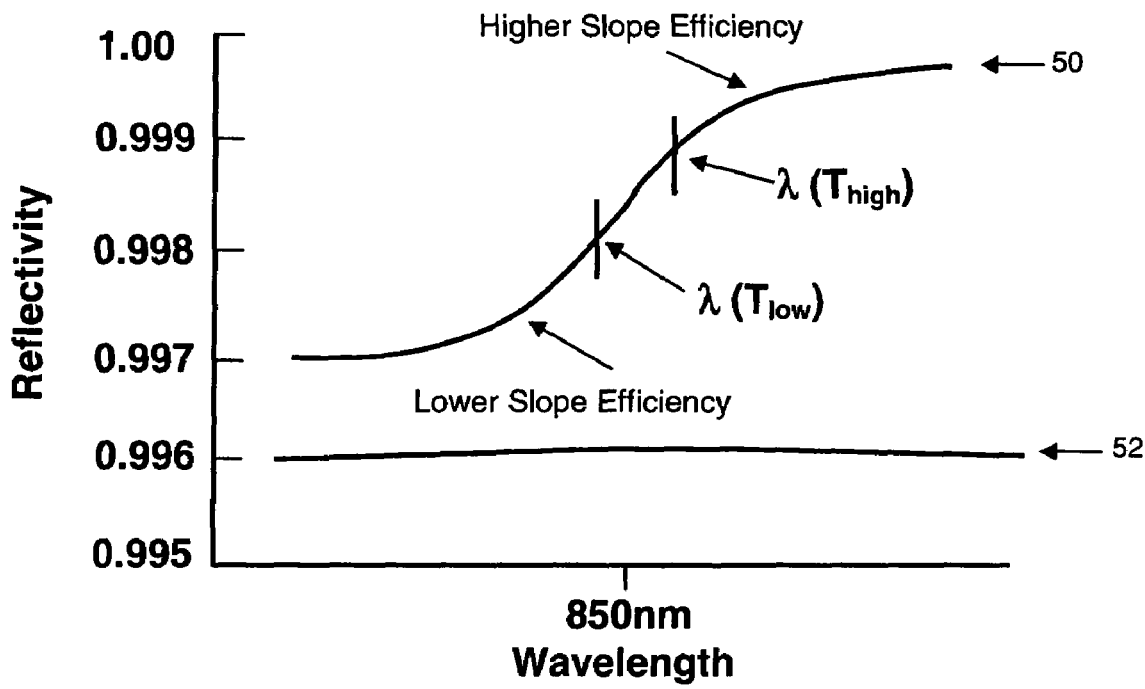
FIG. 5 is a graph of reflectivity vs. wavelength of a semiconductor laser having an non-output mirror modified for slope efficiency temperature compensation and constructed in accordance with a preferred embodiment of the invention.

By applying this approach to the non-output mirror, for convenience described as bottom mirror 704, it is possible to compensate for variation in Ith and in dη/dT simultaneously. In this case, bottom mirror 704 would have the opposite dependence on wavelength/temperature as that shown in FIG. 1, i.e., it would have the reflectivity increasing with wavelength, see FIG. 5. It should also have the appropriate magnitude. Output mirror 720 could have negligible wavelength or temperature dependence as illustrated in FIG. 5. At a lower temperature, the reflectivity is relatively low, e.g., 99.8% or lower, thus a significant portion of the light would transmit out the non-output mirror of semiconductor laser 700. As the temperature increases, mirror 704 reflectivity would increase, e.g., to 99.9% or higher, thereby sending a larger percentage of light out the other (output) mirror, in this example top mirror 720. The slope efficiency of the output end would therefore increase, and would partially, totally, or more than compensate for the quantum-mechanically caused decrease. In this example, the cavity finesse would also increase with increasing temperature. Thus, the current threshold Ith would tend to decrease with increasing temperature, which would compensate for the quantum-mechanically caused increase in $I_{th}$. For FP edge-emitters, it has previously been impossible to compensate for threshold variation or slope variation.

The technique described with respect to bottom mirror 704 has the side effect of interfering with the direct monitoring capability of the bottomside emission from mirror 704. If the output side is used for monitoring laser output, this presents no problem.

Figure 2:
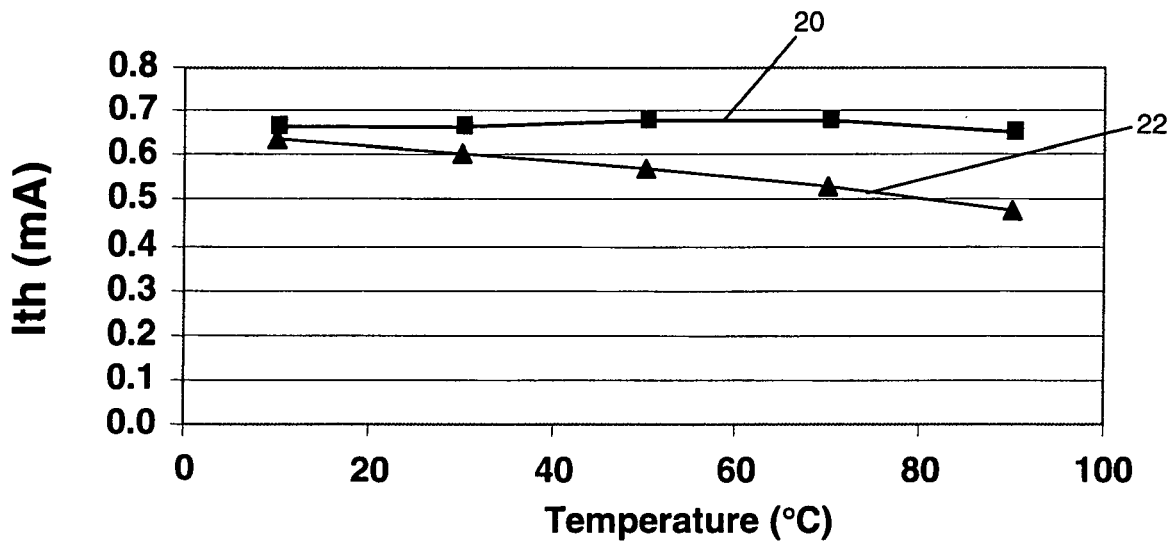
FIG. 2 is a graph of variation of slope efficiency vs. temperature from 10° C. to 90° C. for a semiconductor laser constructed in accordance with a preferred embodiment of the invention.

Turning now to FIG. 2, a graph of variation of slope efficiency and current threshold vs. temperature from 10° C. to 90° C. for a semiconductor laser constructed in accordance with a preferred embodiment of the invention is illustrated. As may be seen by curve 20, the slope efficiency is nearly flat with respect to temperature, in marked contrast to the temperature dependencies of normal VCSELs. For comparison, the slope efficiency vs. temperature is shown as curve 22 for a normal (uncompensated) VCSEL having essentially the same active region structure as was present in the compensated VCSEL used for curve 20. The temperature stability brought about by the described modification of the top mirror is even more dramatically illustrated by the LI characteristics in FIGS. 3 and 4.

Figure 3:
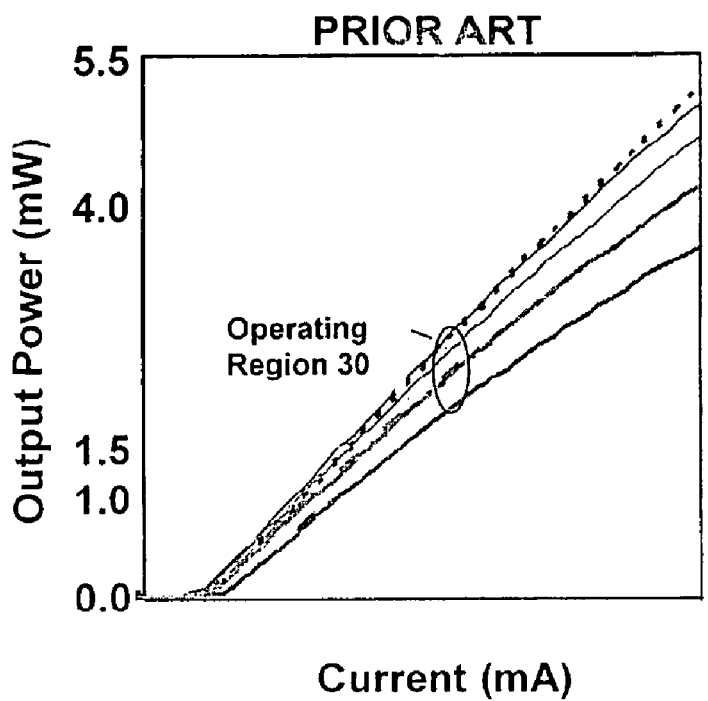
FIG. 3 is a graph of LI characteristics from 10° C. to 90° C. for prior art VCSEL.

Turning now to FIG. 3, a graph of LI characteristics from 10° C. to 90° C. for prior art VCSEL is illustrated. The output power in operating region 30 varies significantly with changes in temperature. As may be seen, with an input current of 5 mA, the output power will vary between 2.7 mW/mA and 1.8 mW/mA due to a temperature change from 10° C. to 90° C. By utilizing the teachings of the present invention, one is able to stabilize output power over significant temperature variation.

Figure 4:
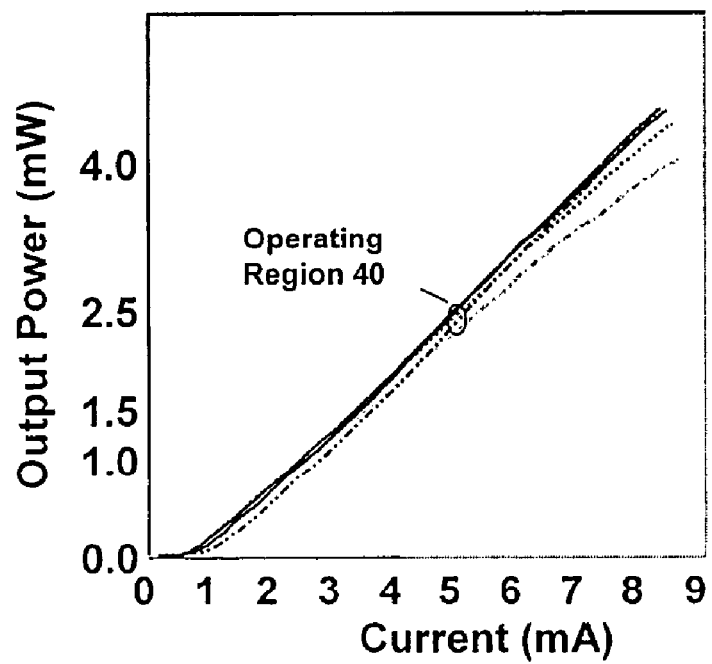
FIG. 4 is a graph of LI characteristics from 10° C. to 90° C. for a semiconductor laser constructed in accordance with a preferred embodiment of the invention.

Turning now to FIG. 4, a graph of LI characteristics from 10° C. to 90° C. for a VCSEL constructed in accordance with a preferred embodiment of the invention is illustrated. The output power in operating region 40 does not vary significantly with changes in temperature. As may be seen, with an input current of 5 mA, the output power will vary between 2.5 mW/mA and 2.4 mW/mA due to a temperature variation between 10° C. and 90° C. Thus, there is a significant improvement of semiconductor laser 700 by utilizing the teachings of the present invention over that of prior art semiconductor lasers. It should be appreciated that the VCSELs used for the data shown in FIGS. 3 and 4 had nominally identical active region structures.

Turning now to FIG. 5, a graph of reflectivity vs. wavelength of a semiconductor laser having an non-output mirror modified for slope efficiency temperature compensation and constructed in accordance with a preferred embodiment of the invention. As may be seen, curve 50 illustrates the reflectivity of the non-output mirror or back mirror. Comparing this graph to FIG. 1, one will notice that the curves 10 and 50 have opposite slopes. In addition, this figure illustrates that output mirror 720 has a relatively flat reflectivity curve 52 with respect to wavelength. it should be appreciated that output mirror 720 may also be modified as discussed in conjunction with FIG. 1.

Figure 6:
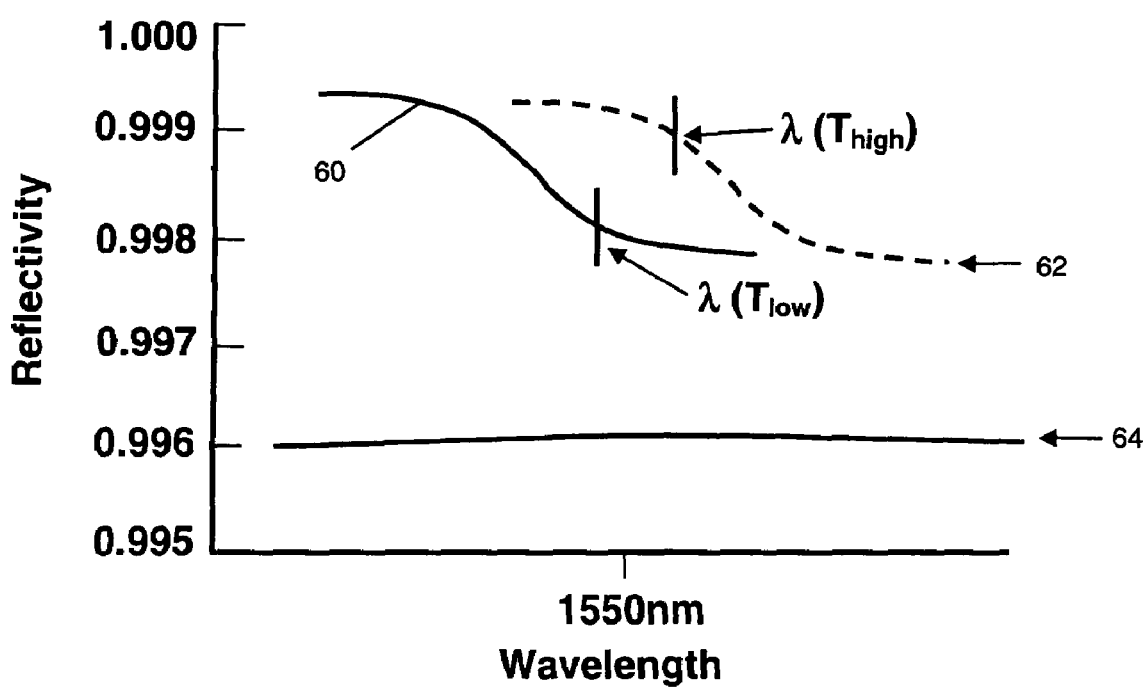
FIG. 6 is a graph of reflectivity vs. wavelength of a semiconductor laser using another approach for temperature compensation and constructed in accordance with a preferred embodiment of the invention.

There are additional means for modifying the slope temperature coefficient (STC) other than that described above. Turning now to FIG. 6, a graph of reflectivity vs. wavelength of a semiconductor laser using another approach for temperature compensation is illustrated. This method differs from the method associated with FIG. 1 in that the reflectivity spectrum remains constant in FIG. 1 while, in FIG. 6, the reflectivity spectrum is modified as described below.

A particularly attractive means makes use of temperature variation of the reflectivity of a mirror caused by a high thermal coefficient of refractive index in one of mirror layer 704, 720, 804, 820 materials. For example, the high-index material in the non-output mirror, in this example bottom mirror 704 or 804, of a VCSEL may comprise a semiconductor whose absorption edge (bandgap) wavelength is very close to that of the cavity, or lasing, wavelength. One example is a VCSEL emitting in the 1.55 μm region, grown on an InP substrate, in which the high-index mirror material comprises (In,Al,Ga)As having an absorption edge (or peak transition wavelength) at a wavelength slightly shorter, e.g., by 1 nm or more, than the lasing wavelength. Another example is an 850 nm VCSEL in which the high-index mirror material comprises (Al,Ga)As having a similar relation to the lasing wavelength. It is worthwhile to note that for a VCSEL, the absorption edge of the high-index mirror material may be at a wavelength that is longer than the peak transition wavelength of the active material.

Since VCSELs typically include gain-offset in the design, for either example the high-index mirror material may even comprise multiple quantum wells having the same composition as the VCSEL active region, or quantum wells having an absorption edge wavelength longer or shorter than that of the active region. In any of these examples the compensation of the STC works as follows. At low temperatures, there is appreciable light transmission through bottom mirror 704, causing loss of the slope efficiency as measured from the output side of the VCSEL. This corresponds to reflectivity curve 60. As the temperature increases, the absorption edge wavelength of bottom mirror 704 increases its wavelength much more rapidly than does the lasing wavelength. The refractive index of a material, especially a semiconductor, varies rapidly in the vicinity of the absorption edge. Thus, the temperature rise has the effect of increasing the refractive index of the high-index mirror material much faster than for the low-index material. Thus, the reflectivity spectrum of bottom mirror 704 is modified from that illustrated by curve 60 to that of curve 62. In a preferred embodiment, the refractive index of the high-index mirror material will increase by a factor of 1.1 or more that the low-index material. Thus, the difference in refractive indices in the bottom mirror materials increases with increasing temperature, and so the reflectivity increases. This increase in reflectivity of the bottom mirror increases the light output through the output mirror. As may be seen, the reflectivity of the output mirror, in this example top mirror 720, is relatively constant and is illustrated by curve 64. This increase in light output compensates for the normally occurring loss in output accompanying temperature rise due to quantum mechanical losses in the active region. The increasing reflectivity of bottom mirror 704 with temperature also has the effect of decreasing current threshold, and therefore adds to the role of gain offset (compensation for the otherwise monotonic increase in threshold with temperature).

The structure just described is particularly attractive for the production of VCSELs emitting at wavelengths 1.2 μm and longer which are grown on InP substrates. A bottom, non-output mirror 704 may be grown on an InP substrate. Low-index mirror layers 703 preferably comprise InP or InAlAs, which is approximately lattice-matched to InP. High-index layers 705 preferably comprise a material having a peak emission wavelength (or absorption edge wavelength) which is close to the laser emission wavelength. Suitable materials include InAlGaAs or InGaAsP with suitable compositions for approximate lattice matching to InP and the stated characteristics for peak emission wavelength or absorption edge wavelength. High-index layers 705 may also comprise a variety of other materials having the desired properties. Examples include bulk (In,Al,Ga)(As,P,Sb,N), and multiple quantum wells comprising for example InGaAs/InAlGaAs. High-index layers 705 may even comprise the same quantum well material used for active region 708. Preferably, non-output or bottom mirror 704 is not intentionally doped. Optional first spacer 706 is preferably doped, for example n-doped (p-doped), and n-contact (p-contact) 728 is preferably made to optional first spacer 706.

It should be appreciated that while we have discussed the refractive index of the high-index mirror material changing much faster than for the low-index material, these materials may have the opposite relationship. Thus, an important feature is that the difference in refractive indices in the non-output mirror materials increases with increasing temperature. While it has been indicated that output mirror 720 is not modified in this embodiment, it should be appreciated that output mirror 720 may be constructed as illustrated in FIG. 1. Thus, the teachings of the two optical methods for temperature compensation, as exemplified by the reflectivity characteristics illustrated in FIGS. 1 and 6, may be combined, as appropriate for both mirrors 704, 720. In fact it is possible to combine the teachings of three optical methods for temperature compensation or parts thereof, as exemplified by the reflectivity characteristics illustrated in FIGS. 1, 5 and 6, as appropriate, for one or both mirrors 704, 720, with either mirror 704 or 720 comprising the output mirror.

For efficient VCSEL operation with one mirror layer absorbing close to the lasing wavelength, it is preferable for the mirror layer to have a very low level of impurities, i.e., the material is preferably not intentionally doped. Since the temperature variation of refractive index varies more strongly closer to the absorption edge, it will be stronger at higher temperatures than at lower temperatures. Since the slope efficiency temperature coefficient is also stronger at higher temperatures, the same sign of nonlinearities in both processes help to maintain an overall more stable response over a larger temperature range.

A rough calculation of an example is now provided, making use of approximations reasonable for an example. Absent any compensation for STC in a well-designed 850 nm VCSEL, the slope efficiency at 70° C. is typically about 80% of its value at 10° C. The back mirror typically has near-unity reflectivity (R, near-zero transmission, or T) and the output mirror is about 99.4% reflective (T~0.4%). Under these conditions, the external differential quantum efficiency (DQE) is about 30% at 10° C., with essentially all the light emitting from the output mirror. Higher or lower DQE's are straightforwardly obtained by adjusting the reflectivities of the mirrors. Now consider a VCSEL having a back mirror as described above with R=99.8% (T=0.2%), and an output mirror with T=0.4%. Since the total mirror transmission loss is the same as before, the total external DQE is still about 30%. The ratio of the beam powers emitted from the two sides of the VCSEL is proportional to the mirror transmissions. Thus the backside DQE would be 10% and the output DQE is about ⅔ the total 20%. In this example, at a higher temperature, e.g. 70° C., the back mirror reflectivity increases to >99.9% (T<0.1%) and the output mirror remains about constant. Due to lower overall mirror transmission loss, the overall DQE is lower, e.g., <24%. But now, the output side of the VCSEL emits greater than ⅘ the total light, or again with approximately 20% DQE.

A simulation has been performed to calculate the change in refractive index required to produce the change in back mirror reflectivity from 99.8% to 99.9%. If the nominal (e.g. 10° C.) refractive indices are 3.2 and 3.6, about 32.5 periods of the mirror layers are required to achieve 99.8% R. For R to increase to 99.9%, the high index needs to increase to about 3.64, assuming the low index changes negligibly. When the mirror layer refractive indices are closer, the refractive index change may be smaller. With nominal refractive indices of 3.3 and 3.6, 43 periods are needed for 99.8% reflectivity and the high-index layer needs only to increase to 3.63 for the increase to R=99.9%. For a temperature rise from 10° C. to 70° C., at a nominal wavelength of 845 nm, the bandgap of the material will shift to about 20 nm longer wavelength, and the cavity resonance will shift ~5 nm longer. The differential is therefore about 15 nm relative shift between the absorption edge of the high-index material and the lasing wavelength. Comparison with published data of refractive index vs. wavelength, the slope of the refractive index is sufficiently high to cause a 0.03 or 0.04 refractive index change with a 15 nm relative shift resulting from the 60° temperature rise. These conditions are approximated for the high-index material comprising the same material as the VCSEL active region. It is possible to achieve high precision in the STC compensation by making the high-index material identical or very similar to the active region and by designing the low-index mirror material to have the appropriate refractive index such that the refractive index change in the high-index material produces the desired change in mirror reflectivity.

Figure 8:
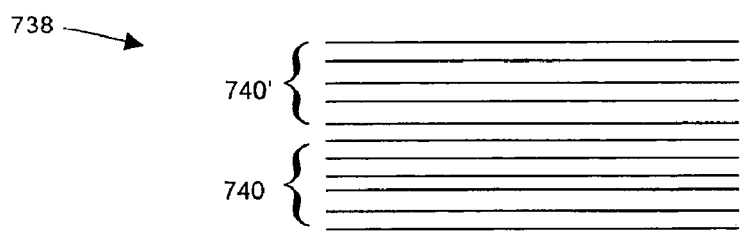
FIG. 8 is a cross-sectional side view of a mirror constructed in accordance with a preferred embodiment of the invention.

FIG. 8 shows a mirror 738 that comprises first portion 740 and second portion 740' that may have a distinct structure from first portion 740. This is illustrated in FIG. 7 by optional mirror layers 722' and 742'. In a preferred embodiment, first portion 740 would be a conventional mirror structure that is not modified by the teachings discussed above. Portion 740' will incorporate the teachings of the present invention by modifying these layers to provide temperature control to the overall mirror 738. Thus, it is possible to produce a hybrid mirror with the teachings of the present invention. Further details of this hybrid mirror are provided in Example 1, below. It should be appreciated that either mirrors 704 or 720 may incorporate the teachings of a hybrid mirror. While it has been illustrated that mirror portions 704, 740' are in direct contact, it should be appreciated that there may be an intermediate spacer or other structure disposed between them.

Figure 9:
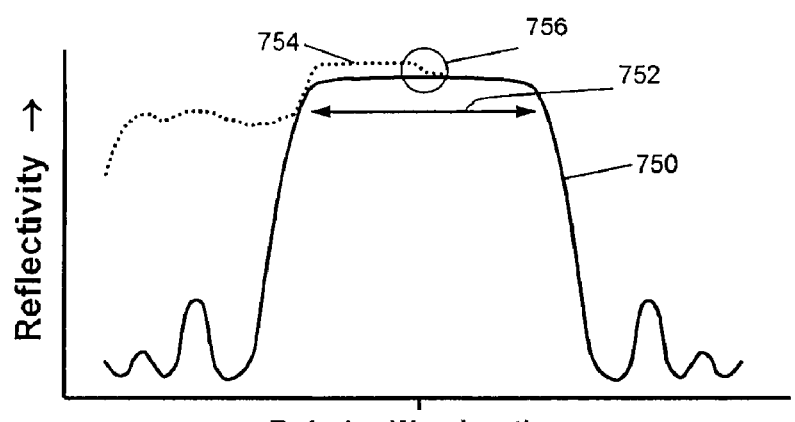
FIG. 9 is a graph of reflectivity vs. wavelength of a semiconductor laser mirror illustrating an approach for temperature compensation and constructed in accordance with a preferred embodiment of the invention.

FIG. 9 shows an exemplary mirror reflectivity 750 which is typical for a stack of alternating high-index and low-index layers, each being one quarter wave thick. Curve 750 may correspond to either a prior art mirror or first portion 740 of mirror 720. As may be seen, the high reflectivity region 752 is centered about the emission wavelength of the laser. The reflectivity width is indicated by the double arrowed line. Traditionally, region 752 is designed to be as wide as possible and as flat a possible. Dashed line 754 represents the overall reflectivity of mirror 738 that includes the addition of layers 740'. The region of line 754 enclosed by circle 756 is illustrated by FIG. 1. This region corresponds to the maximum slope, i.e., Δ reflectivity vs. emission wavelength, which would be preferably disposed at the emission wavelength of semiconductor laser 700.

Figure 10A:
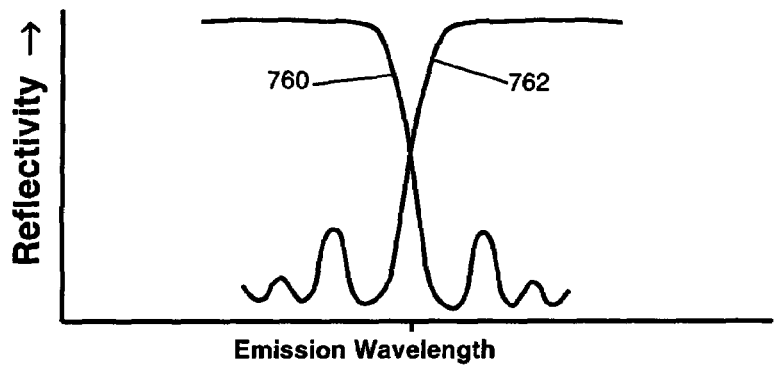
FIG. 10A is a graph of reflectivity vs. wavelength of a portion of a semiconductor laser mirror illustrating two approaches for temperature compensation and constructed in accordance with a preferred embodiment of the invention.

Turning now to FIG. 10A, the reflectivity for portion 704' for a mirror 738 is illustrated by curve 760. Since the reflectivity for portion 704 decreases with wavelength, curve 760 is suitable for describing the reflectivity of an output mirror, e.g., top mirrors 702, 820. As may be seen by curve 762, the reflectivity for portion 740' is illustrated if it was incorporated into non-output mirror 704. This figure is provided to illustrate that for output mirror 720, the slope of curve 760 is negative. The curve for second portion 740' of non-output mirror 704 is illustrated by curve 762. As may be seen, this curve has the opposite slope as curve 760. It should be appreciated that while curves 760 and 762 are illustrated as exact opposites, this is for illustrative purposes only. The important feature that is illustrated is that the output mirror preferably has a negative slope and the non-output mirror preferably has a positive slope at the emission wavelength. The exact reflectivity curve is not relevant to the teachings of the present invention so long as the reflectivity changes substantially about the emission wavelength.

Figure 10B:
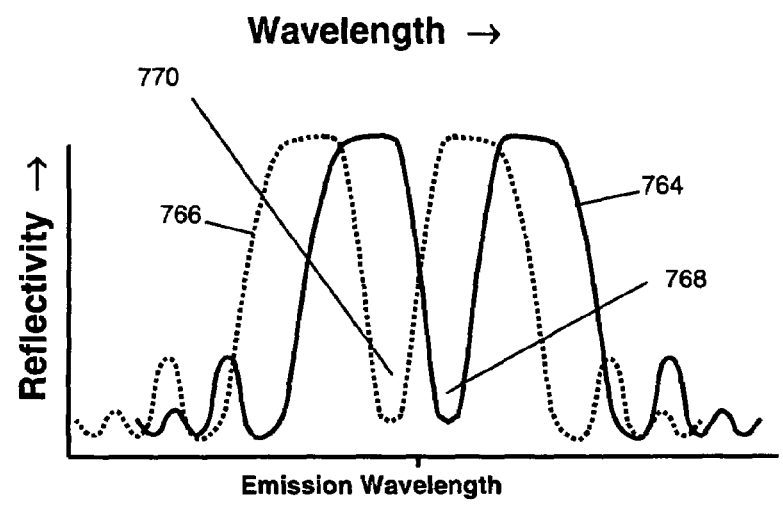
FIG. 10B is a graph of reflectivity vs. wavelength of a portion of a semiconductor laser mirror illustrating two additional approaches for temperature compensation and constructed in accordance with a preferred embodiment of the invention.

Turning now to FIG. 10B, another method for changing the reflectivity is illustrated. The reflectivity for output mirror 720 is illustrated by curve 764. As may be seen by curve 766, the reflectivity for non-output mirror 704 is also illustrated. This figure is provided to illustrate that a substantial change in reflectivity may be created by utilizing a spacer in the mirror structure. These types of mirrors are commonly used in interference filters. As may be seen, there is a substantial drop 768 and 770 in respective reflectivity curves 764 and 766. Thus, by designing a mirror appropriately, one is able to create a substantial slope associated with change in reflectivity vs. wavelength. As may be seen, curve 766 has the opposite slope of curve 764 about the emission wavelength. It should be appreciated that while curves 764 and 766 are illustrated as having similar shapes, this is for illustrative purposes only. The important feature that is illustrated is that the output mirror will have a negative slope and the non-output mirror will have a positive slope at the emission wavelength. The exact reflectivity curve is not relevant to the teachings of the present invention so long as the reflectivity changes substantially about the emission wavelength.

Figure 11:
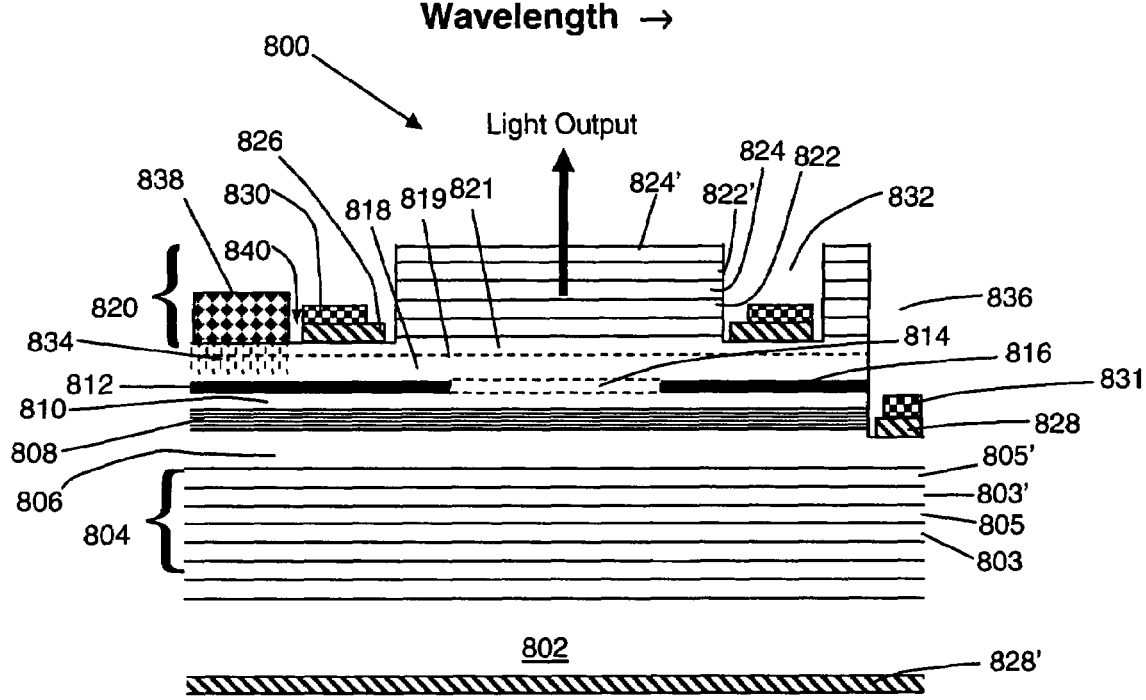
FIG. 11 is a cross-sectional side view of another VCSEL constructed in accordance with a preferred embodiment of the invention.

The structure described above may be used for most, if not all, VCSEL types, including visible-wavelength-emitting VCSELs grown on GaAs substrates, VCSELs emitting in the near infra-red regions such as the 750 nm-1050 nm on GaAs substrates, and VCSELs emitting at wavelengths greater than 1050 nm, for example ~1300 nm, on GaAs substrates. However the structure is particularly attractive for VCSELs grown on InP substrates especially those emitting at wavelengths greater than 1200 nm. FIG. 11 is now described in the context of a 1550 nm VCSEL grown on an InP substrate, though it may describe a laser comprising any materials and emitting at any wavelength. It should be appreciated that the elements described in conjunction with FIG. 7 may be mapped to the discussion below. For example, element 702 corresponds to element 802 as further described below.

Turning now to FIG. 11 there is shown laser 800 comprising a substrate 802 which is InP for this example, but could be GaAs or any other suitable material. Bottom mirror 804 comprises optional low-index layers 803 and optional high-index layers 805. As may be seen by optional layers 803' and optional layers 805', bottom mirror 804 may comprise two different portions which may have different characteristics as described in FIG. 8, below. Laser 800 also comprises optional first conductive spacer 806, active region 808, optional second conductive spacer 810, optional oxidation aperture 812 comprising optional non-oxidized portions 814 surrounded by optional oxidized portions 816, optional third conductive spacer 818, optional tunnel junction 819, optional fourth conductive spacer 821, top mirror 820 comprising optional low-index layers 822 (822') and optional high-index layers 824 (824'), optional top contact 826, optional bottom contact 828, optional top interconnect metal 830, and optional bottom interconnect metal 831. As may be seen by optional layers 822' and optional layers 824', top mirror 820 may comprise two different portions which may have different characteristics as described in FIG. 8, above. Isolation between lasers 800 may be optionally provided by inner trenches 832, by insulating regions 834, or by deeper trenches 836, or by building lasers 800 on mesas. Alternatively, separate lasers

800 may be diced from a wafer. Mounted on conductive spacer 821 is an additional metal piece 838 that is seperated from top contact 826 and top interconnect metal 830 by an air gap 840. Additional metal piece 838 is thicker than top contact 826. Mirrors 804 and 820 along with active region 808 and optionally one or more spacers and/or apertures and/or junctions form an optical cavity. Of the light that escapes by transmission through the mirrors, by definition the majority of output light emits through the output mirror, which may be either top mirror 820 or bottom mirror 804. If bottom mirror 804 comprises a low- or non-intentionally-doped layer 803 (or 805, or 803' or 805'), it may be preferable for bottom contact 828 to connect directly to first optional spacer 806, as shown. Similarly, it may be preferable for top contact layer 826 to connect directly to one of the optional spacers appearing above the active region.

In bottom mirror 804, low-index layers 803 (803') may comprise InP or InAlAs or other materials such as AlAs or AlGaAs. High-index layers (805, 805') may preferably comprise InAlGaAs or InGaAsP with suitable composition for approximate lattice matching to InP and which produce a peak emission wavelength or absorption edge wavelength close to the emission wavelength of laser 800. For example, a VCSEL designed for a 1550 nm lasing wavelength may have at least one high-index layer 805 or 805' having a peak emission wavelength (or absorption edge wavelength) greater than 1410 nm, i.e., the peak emission wavelength may be greater than 91% of the lasing wavelength. Preferably, bottom mirror 804 comprises materials, e.g., semiconductors, which have relatively little or no intentional doping in order to minimize optical absorption. In this case high-index layers 805 (805') may have a peak emission wavelength at greater than about 95% of the lasing wavelength, e.g., at 1475 nm or greater for a 1550 nm lasing wavelength. High-index layers 805 (805') may also comprise a variety of other materials having the desired properties. Examples include bulk (In,Al,Ga)(As,P,Sb,N) and multiple quantum wells or superlattices comprising for example InGaAs/InAlGaAs. High-index layers 805 (805') may even comprise the same or similar quantum well material that is used for active region 808. Top mirror 820 may comprise layers having properties similar to those just described for bottom mirror 804. Alternatively, all or a portion of either mirror may comprise dielectric layers and/or at least one metal layer.

Optional tunnel junction 819 may comprise a thin planar structure or it may comprise an aperture in which current preferentially flows through a central portion in a similar manner that current flows preferentially through the central portion of an oxide-defined aperture.

EXAMPLE 1

Experiments were conducted on experimental VCSELs. In experimental VCSELs, if the temperature was raised from 10° C. to 70° C., the slope efficiency at the higher temperature is less than 80% of the slope at the lower temperature. In a first experiment using a slight modification of the VCSEL top mirror as described above, the magnitude of $d\eta/dT$ was experimentally reduced to less than ½; the slope efficiency at 70° C. was greater than 91% of the 10° C. value. Further reductions in $d\eta/dT$ were made by making more changes to the top mirror.

The experimental reduction in $d\eta/dT$ was achieved by using a top-emitting VCSEL whose top mirror reflectivity decreased with increasing wavelength, see FIGS. 1, 8 and 10A. Since the wavelength of a semiconductor laser increases with temperature, the increased wavelength resulted in a lower reflectivity of the mirror. The lower reflectivity produced a relative increase in $\eta$, which largely compensated for the quantum-mechanically caused reduction in $\eta$. The actual VCSEL top mirror mostly comprised a first portion of alternating layers of AlGaAs having high-Al and low-Al concentrations. This portion of the top mirror was not designed to have any significant reflectivity variation over normal operating temperature ranges, see curve 750 of FIG. 9. A second portion 704' comprising 6 pairs of quarter-wave high- and low-index dielectric layers were added to the top mirror. Thus, a hybrid mirror 720 comprising 2 separate portions may be used in conjunction with the teachings of the present invention. The center wavelength of the dielectric layers was 724 nm, and was deliberately offset from the lasing wavelength of 850 nm. The lasing wavelength was therefore just out of the high-reflectivity region of the dielectric stack, and was in fact in the region where the variation of reflectivity vs. wavelength is highest. Since the VCSEL wavelength varies only about 3.6 nm in the 10°-70° C. range, it was required to have significant variation in the top mirror reflectivity in just a few nm of wavelength. The reflectivity spectrum of the dielectric part of the top mirror does not change significantly with temperature. As the temperature rose, the lasing wavelength increased, thus the top mirror reflectivity decreased at the lasing wavelength, mainly due to the change in wavelength, and the "normal" drop in $\eta$ was compensated. The reflectivity of the top mirror is similar to those illustrated in FIGS. 1 and 9. As illustrated in FIG. 1, the reflectivity varied from about 99.3% to over 99.8% for the top mirror.

A VCSEL of the present invention was tested for slope efficiency and threshold current at a number of temperatures. The variation of slope efficiency and current threshold vs. temperature for this VCSEL are shown as curve 20 in FIG. 2. The slope efficiency is nearly flat with respect to temperature, in marked contrast to the temperature dependencies of normal VCSELs. The slope efficiency vs. temperature is shown as curve 22 for a prior art VCSEL having essentially the same structure, except for the second portion of the top output mirror, i.e., the dielectric mirror layers. The temperature stability brought about by the described modification of the top mirror is even more dramatically illustrated by the light output vs. current, or LI characteristics in FIGS. 3 and 4. FIG. 3 shows the LI from 10-90° C. for a "normal" prior art VCSEL, while FIG. 4 is for a temperature-compensated VCSEL of the present invention.

The techniques described above may also be applied to edge-emitting lasers, whether Fabry-Perot (FP) or DFB. For example, one facet could be coated with a high-reflectivity mirror, while the other (output) mirror could have the wavelength/temperature varying mirror. The temperature compensation may be easier for the FP edge-emitter than for a VCSEL because the temperature variation of the wavelength is much higher, e.g., about 18 nm over the same 10°-70° C. range. Thus, the wavelength variation of the dielectric mirror does not need to be nearly so great in order to compensate. Such a mirror could have large effects on the output wavelength of the edge-emitter however, due to the presence of multiple longitudinal modes that result from the typically-long cavity lengths of edge-emitting lasers.

Although the present invention has been fully described in conjunction with the preferred embodiment thereof with reference to the accompanying drawings, it is to be understood that various changes and modifications may be apparent to those skilled in the art. Such changes and modifications are to be understood as included within the scope of the present invention as defined by the appended claims, unless they depart therefrom.

What is claimed is:

1. A device comprising a vertical-cavity surface-emitting laser (VCSEL) comprising:
a substrate;
a bottom mirror located above the substrate;
an active region located above the bottom mirror;
a top mirror located above the active region;
a top contact mounted on a first conductive spacer located above the active region;
top interconnect metal in electrical contact with the top contact;
a bottom contact mounted on a second conductive spacer located below the active region; and
an additional metal piece mounted on the first conductive spacer, wherein the additional metal piece and the top contact are separated from each other by a gap.

2. The device of claim 1, wherein the additional metal piece is thicker than the top contact.

3. The device of claim 1, wherein the additional metal piece is separated from the top interconnect metal by the gap.

4. The device of claim 1, wherein the substrate comprises InP.

5. The device of claim 1, wherein the substrate comprises GaAs.

6. A device comprising a vertical-cavity surface-emitting laser (VCSEL) comprising:
a substrate;
a bottom mirror located above the substrate;
an active region located above the bottom mirror;
a first top contact mounted on a first conductive spacer located above the active region;
a second top contact mounted on the first conductive spacer;
a top mirror mounted on the first conductive spacer and extending upwards between the first top contact and the second top contact;
a bottom contact mounted on a second conductive spacer located below the active region; and
an additional metal piece mounted on the first conductive spacer, wherein the additional metal piece and the first top contact are separated from each other by a gap.

7. The device of claim 6, wherein the additional metal piece is thicker than the first top contact.

8. The device of claim 7, wherein the additional metal piece is separated from the first top interconnect metal by the gap.

9. The device of claim 7, wherein the substrate comprises InP.

10. The device of claim 7, wherein the substrate comprises GaAs.

11. The device of claim 1, wherein the additional metal piece and the top contact are separated from each other only by the gap.

12. The device of claim 6, wherein the additional metal piece and the top contact are separated from each other only by the gap.

* * * * *